(12) United States Patent
Duquette

(10) Patent No.: US 6,291,830 B1
(45) Date of Patent: Sep. 18, 2001

(54) METHODS AND APPARATUS FOR CONTROLLING GLINT IN A POSITION ALIGNMENT SENSOR

(75) Inventor: David W. Duquette, Minneapolis, MN (US)

(73) Assignee: CyberOptics Coporation, Golden Valley, MN (US)

( * ) Notice: Subject to any disclaimer, the term of this patent is extended or adjusted under 35 U.S.C. 154(b) by 0 days.

(21) Appl. No.: 09/430,713

(22) Filed: Oct. 29, 1999

Related U.S. Application Data
(60) Provisional application No. 60/106,283, filed on Oct. 30, 1998.

(51) Int. Cl.[7] .................................................. G01B 11/00
(52) U.S. Cl. .......................... 250/559.3; 359/399; 702/150
(58) Field of Search ..................... 250/559.12, 559.29, 250/559.3, 559.37; 356/399, 400, 612, 638; 702/150; 29/833, 834

(56) References Cited

U.S. PATENT DOCUMENTS

| | | | |
|---|---|---|---|
| 4,974,010 | 11/1990 | Cleveland et al. | 354/403 |
| 5,278,634 | 1/1994 | Skunes et al. | 356/400 |
| 5,377,405 | 1/1995 | Sakurai et al. | 29/833 |
| 5,491,888 | 2/1996 | Sakurai et al. | 29/832 |
| 5,559,727 | * 9/1996 | Deley et al. | 356/400 |
| 5,818,061 | * 10/1998 | Stern et al. | 250/559.3 |
| 5,897,611 | * 4/1999 | Case et al. | 702/150 |

FOREIGN PATENT DOCUMENTS

| | | |
|---|---|---|
| 8-111598 | 4/1996 | (JP) . |
| 9-210626 | 8/1997 | (JP) . |
| 9-214198 | 8/1997 | (JP) . |

* cited by examiner

Primary Examiner—Stephone B. Allen
(74) Attorney, Agent, or Firm—Westman, Champlin & Kelly, P.A.

(57) ABSTRACT

A method and apparatus reduces two types of undesirable glints in an optical position alignment sensor designed to orient at least two components. In one aspect, a method includes using an aperture and a positive optic to block large angle glint generated by the components. In another aspect, a detector is positioned behind the image plane of the components to reduce the effect of small angle glint.

17 Claims, 7 Drawing Sheets

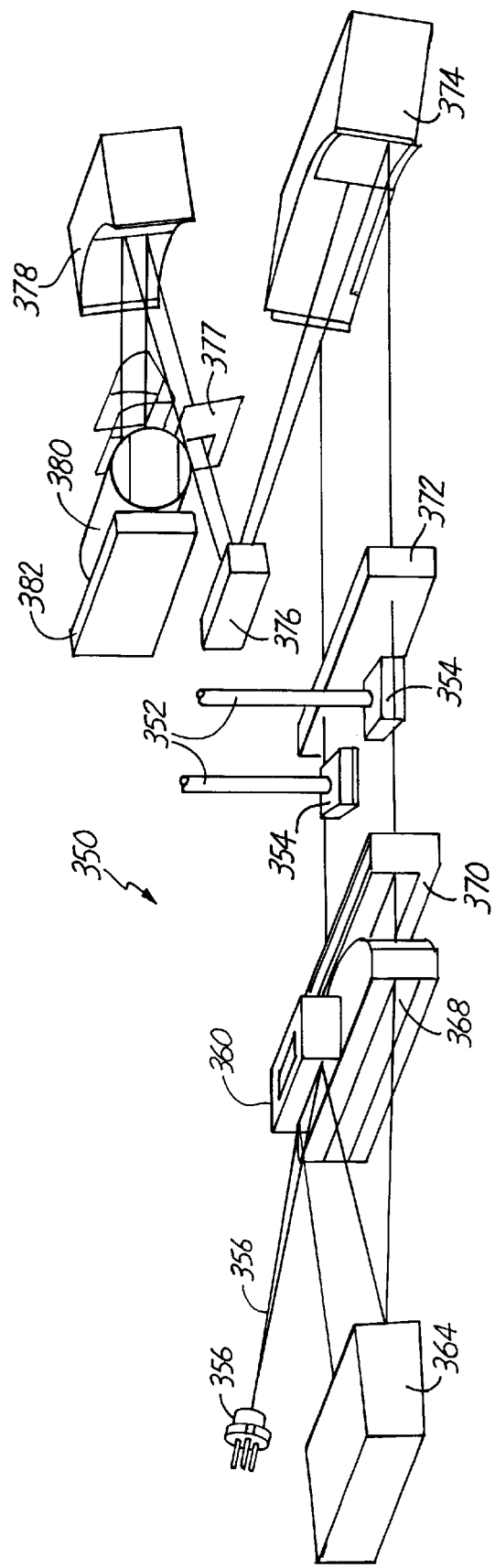

METHODS AND APPARATUS FOR
CONTROLLING GLINT IN A POSITION
ALIGNMENT SENSOR

This application claims priority benefits from U.S. provisional patent application No. 60/106,283, entitled "IMPROVED METHODS AND APPARATUS FOR CONTROLLING GLINT IN A MULTI-NOZZLE POSITION ALIGNMENT SENSOR" filed on Oct. 30, 1998.

BACKGROUND OF THE INVENTION

The present invention relates generally to an optical position alignment sensor for aligning electronic components, which is used in the electronic component placement industry. Machines of the type used in the electronic component placement industry are sometimes called pick and place machines.

Electronic shadowing techniques incorporated in optical-based sensors are in widespread use today in the electronics industry in pick and place machines for mounting electronic components on printed circuit boards. One of the most commonly used position alignment sensors is manufactured by CyberOptics Corporation in Golden Valley, Minn. and is sold as a LaserAlign® component alignment sensor. Laser-Align type sensors use a light source focused into a stripe of light, which is typically incident on the side of an electronic component, thereby forming a shadow which is cast onto a detector. When the electronic component is rotated (by a nozzle controlled in x, y and z direction by the pick and place machine), the shadow cast on the detector changes in width.

The orientation process is generally carried out while the pick and place machine is transporting the component to a target printed circuit for placement. When the orientation process is carried out simultaneously with the transport of the component, the orientation process is sometimes referred to as an "on-head" or an "on-the-fly" measurement. Conversely, "off-head" measurements are made when the sensor is not affixed to the pick and place head but rather, is stationary relative to the head.

One of the problems typically not addressed by the prior art is a position alignment sensor for aligning at least two components which prevents undesirable glints (i.e., reflections), both large and small angle, from interfering with accurately orienting either of the components.

SUMMARY OF THE INVENTION

The present invention includes a method and apparatus which reduce two types of undesirable glints (small and large angle glints) in an optical position alignment sensor designed to orient at least two components. The method includes shining a plurality of rays of light onto the components, the rays directed generally perpendicularly to a central axis of each of the components where each of the components block the rays to cast a shadow of the outline of the components. Some of the rays of light are specularly reflected from one of the components to provide a large-angle glint, which is the first type of glint reduced by the present invention. The method then passes the rays of light through an optic with positive power so as to focus the two shadows at a focal point, the optic focuses an image of the shadows at a component plane located behind the focal point. An aperture is positioned substantially at the focal point and an opening in the aperture is positioned to allow the rays of light to pass therethrough except for the large-angle glint. The combination of the positive optic and the aperture prevents the large angle glint from reaching the detector. A detector is positioned behind the component plane and a plane of the detector is positioned parallel to the plane of the optics, so that an unfocused image of the shadows falls on the detector. The placement of the detector behind the image of the component plane reduces the effect of the small angle glint of the present invention.

BRIEF DESCRIPTION OF THE DRAWINGS

FIG. 7 shows the embodiment in FIG. 6 in a perspective drawing.

DETAILED DESCRIPTION OF THE ILLUSTRATIVE EMBODIMENTS

Figure 1:
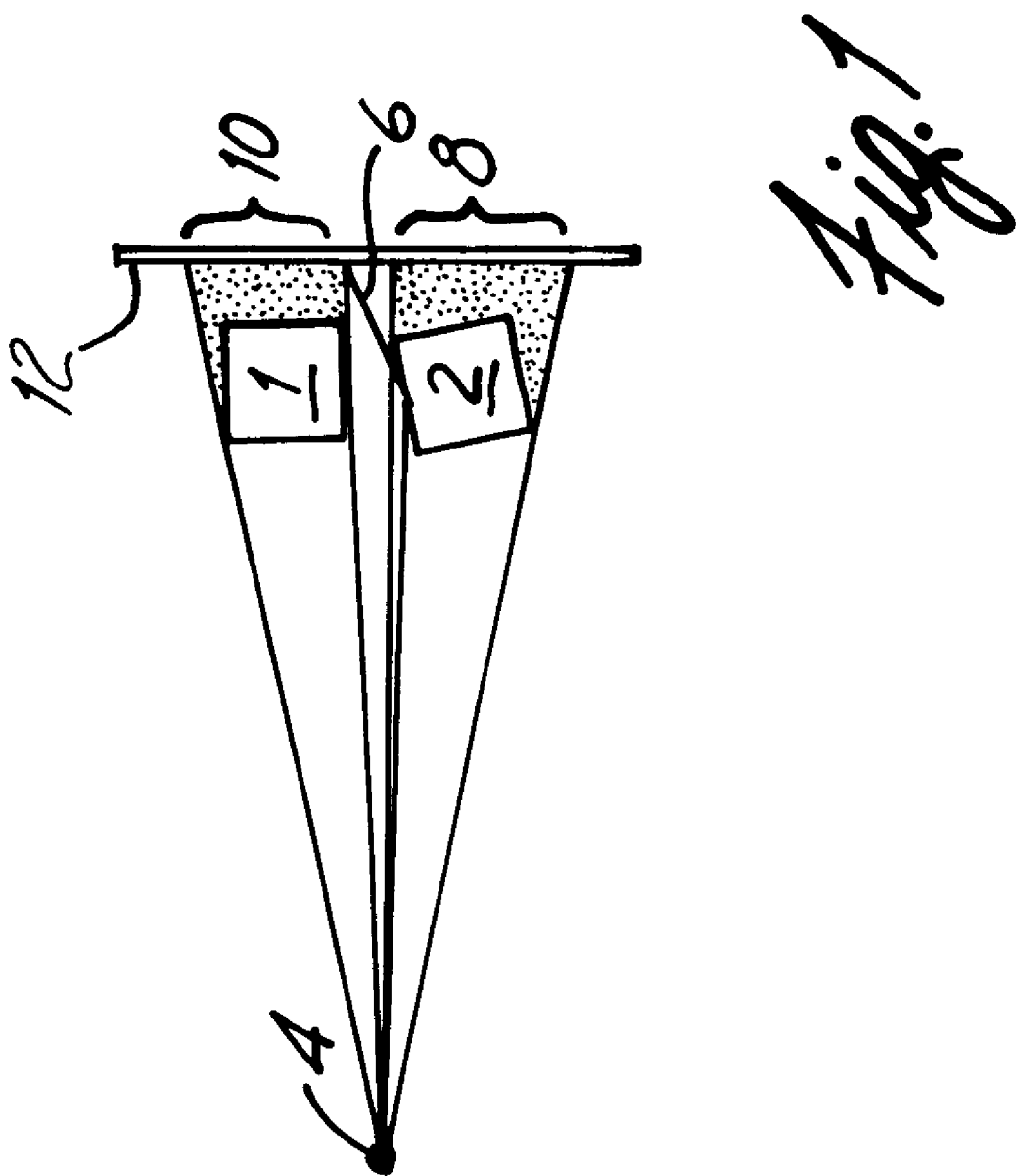
FIG. 1 shows a source of light, two components, a detector with a glint specularly reflected off of one component.

FIG. 1 illustrates the problem of glint which the present invention solves. FIG. 1 shows a source of light 4, with rays of light incident on component 1 and component 2, each component is held in place in a sensor by a nozzle (not shown) of a pick and place machine (not shown). In the illustration, one of the rays of light specularly reflects off the edge of component 2, causing an undesirable glint 6. Components 1 and 2 each cast a shadow image 8,10 onto a plane of a CCD detector 12. Detector 12 outputs to a set of electronics (not shown) which isolate the edges of the shadows cast onto detector 12 and send signals to motor control circuitry for the pick and place machine. The glint falls onto that portion of the detector which is receiving the shadow cast from component 1, thereby erroneously adding to the light detected by detector 12 and attributed to component 1. If the glint is located toward the outline of the shadow cast on detector 12, the electronics in the sensor may improperly assess the outline of the shadow, resulting in an incorrect assessment of the relative position of component 1.

Figure 2:
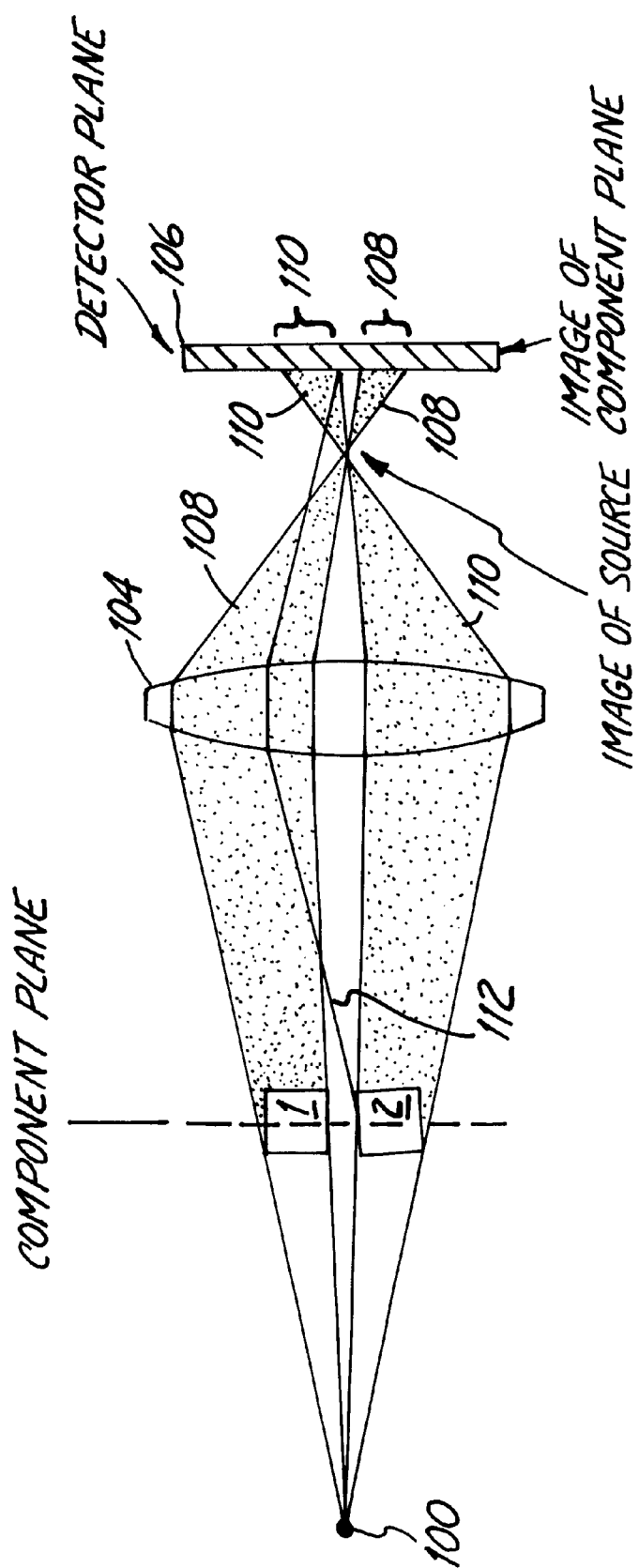
FIG. 2 shows a source of light and two components, followed by a positive optic and a detector, a glint from one of the components falling on the detector at the same point as the shadow cast by one of the components.

FIG. 2 is a diagram which shows an additional aspect of the problem the present inventions solves, where a source of light 100, components 1 and 2, optics 104 with positive power and a CCD detector 106 are shown. With the positive optics 104, the rays of light from source 100 converge and form images of the shadows of components 1 and 2, labeled respectively at 108,110, which are subsequently detected at detector 106. An undesirable glint 112 is specularly reflected off of component 2, and is passed through optics 104 and is improperly added into the image of component 2 as detected at detector 106. The embodiment shown in FIG. 2 forms a real image of the component plane on detector 106 by virtue of the positive optics 104. In this configuration image glints are focused back to a point located very near to the edge of the image of the shadow of the component that caused the glint. As shown in FIG. 2, the glint from component 2 is focused back onto the shadow image of component 2. The glint no longer interferes with the detected shadow of component 1 as in FIG. 1, but now does interfere with the detected shadow of component 2.

Figure 3:
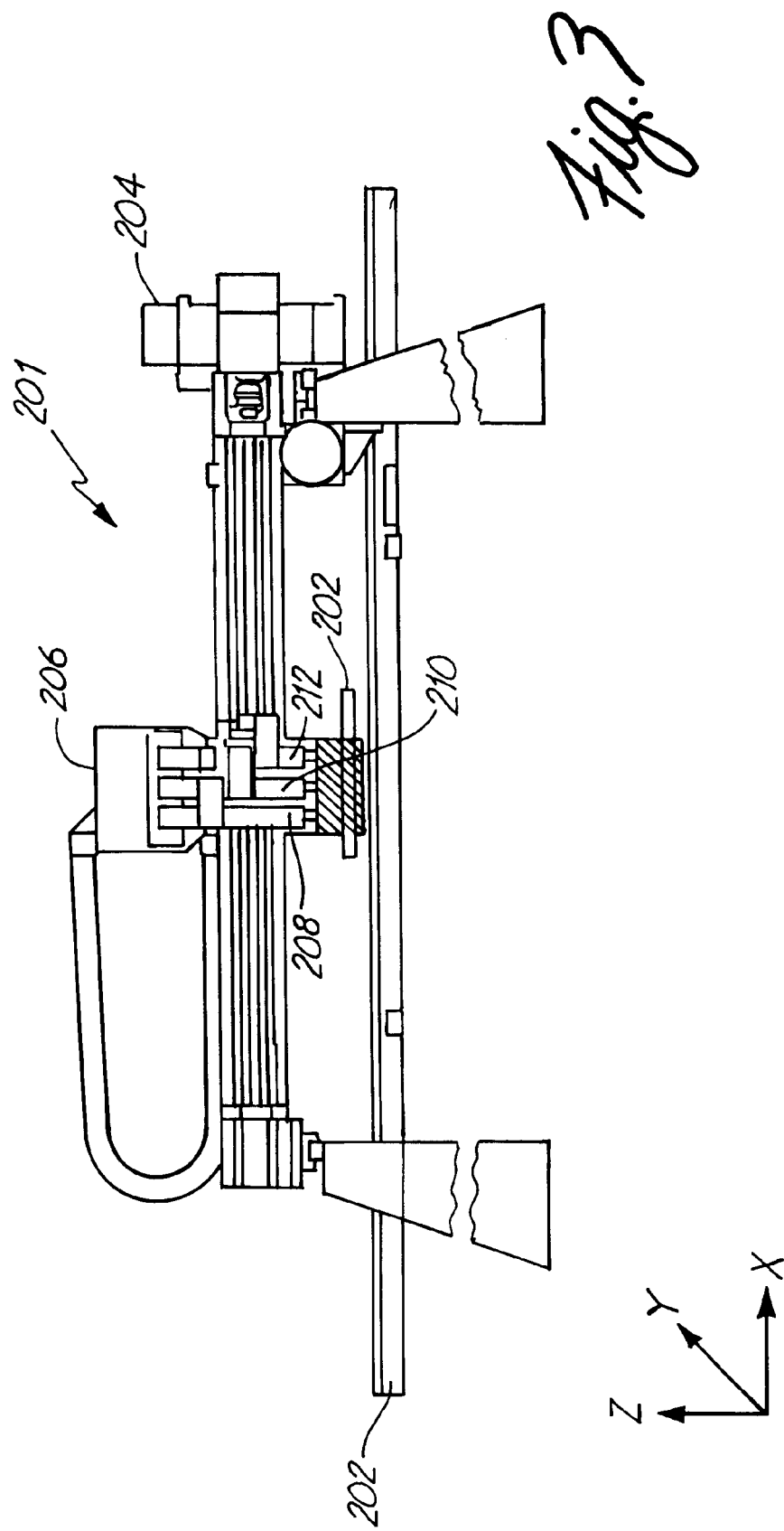
FIG. 3 shows a pick and place machine which includes a sensor of the present invention.

A multi-nozzle pick and place machine, shown generally at 201 in FIG. 3, has a conveyor system (not shown) for transporting a printed circuit board 202 into a working area. Pick and place machine 200 includes an x and y motor drive assembly at 204 for moving a vacuum head 206 independently in the x and y directions. Attached to head 206 are multiple vacuum nozzles 208,210,212 for releasably holding three components. Head 206 picks up each of the three components at trays (not shown) and while the head is transporting the components to PC board 202, a multi-nozzle alignment sensor of the present invention 200 senses the x,y and theta orientation of the components.

The pick and place machine 201 is an on-head pick and place machine, since sensor 200 senses the x,y and theta orientation of the components while head 206 transports the components to board 202. Other types of pick and place machines are equally adaptable for use with the present method and apparatus of the present invention, such as off-head pick and place machines, turret style pick and place machines or pick and place machines which have different gantry systems for moving the head in x or y directions.

Figure 4:
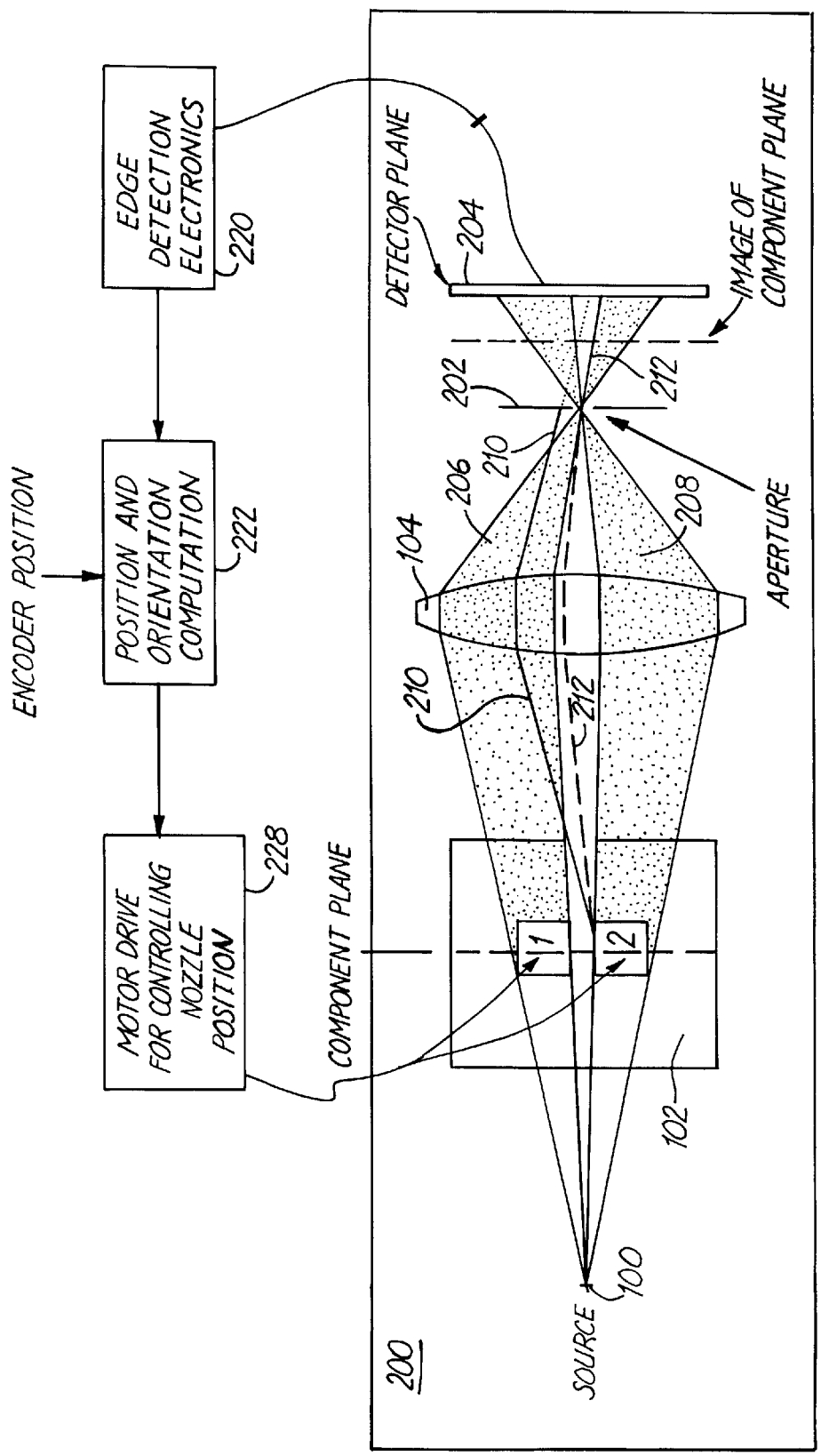
FIG. 4 shows an embodiment of the present invention, including a source of light and two components, a positive optic, an aperture and a detector, where the plane of the detector is behind the plane of the images of the shadows from the components.
Figure 5:
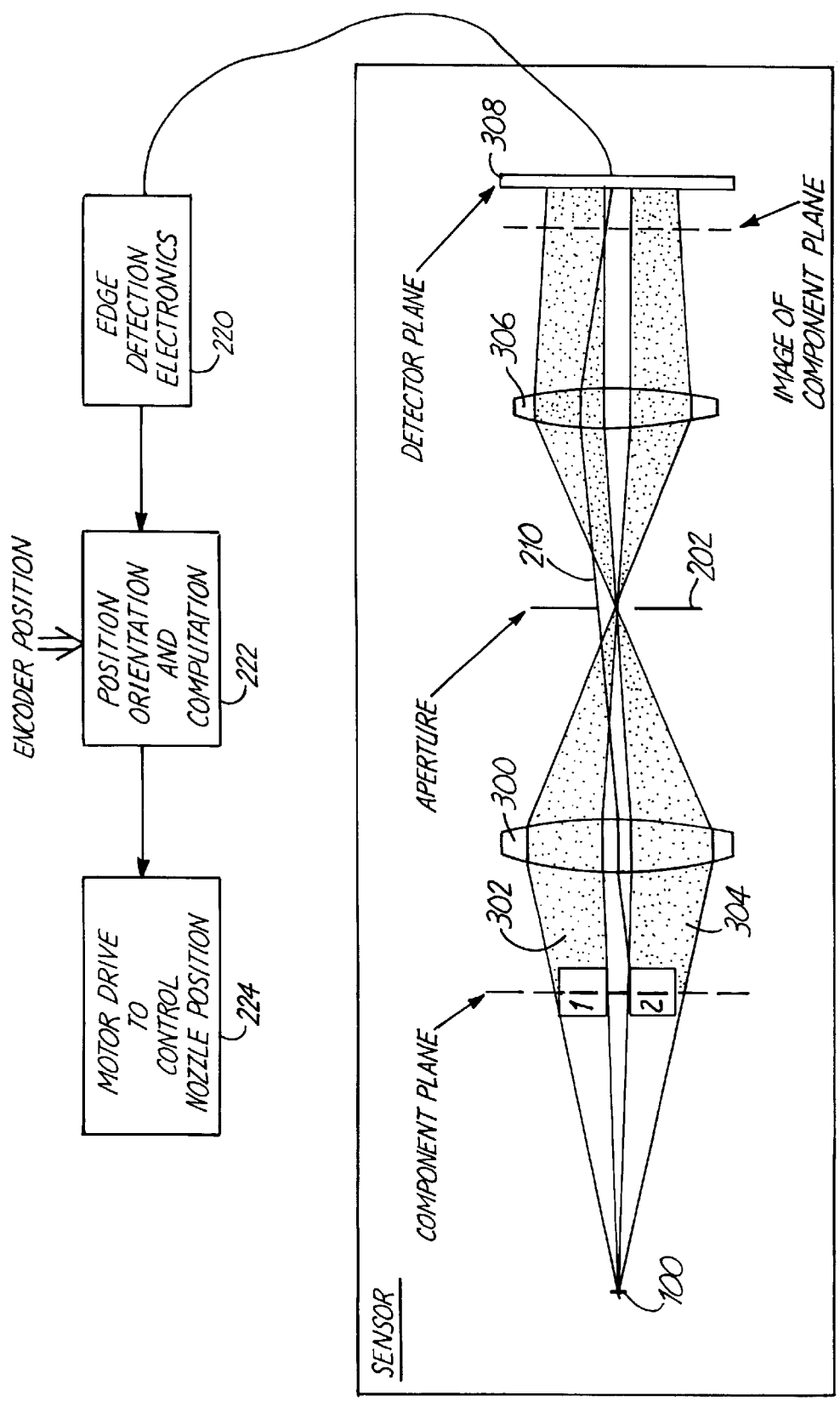
FIG. 5 shows another embodiment of the present invention, including a source of light and two components, a positive optic, an aperture, a collimating optic and a detector, where the plane of the detector is behind the plane of the images of the shadows from the components.

The present invention, as shown in FIGS. 3–7, is implemented with two independent aspects. The first aspect is implemented in the positive optics and an aperture, which together function to physically block large-angle glints such as glint 210 from reaching the detector. However, glints which pass through the aperture (sometimes referred to herein as small-angle glints such as glint 212) are imaged at the edge of the shadow, as seen at the image of the component plane, as shown in FIGS. 4 and 5. The second aspect is implemented in the placement of the detector behind the image of the component plane, which causes the small angle glints (which have passed through the aperture) to fall on the detector between the component shadows, well away from the edges of the shadows.

A single component alignment sensor which uses collimated light, including the methods and apparatus of determining orientation of the single component, is detailed in U.S. Pat. No. 5,278,634 to Skunes et al., owned by the present assignee and hereby incorporated by reference. All the embodiments of the present invention as it is used with collimated light include processing hardware of the same sort as disclosed in Skunes, or as appropriate, operates on principles such as that the width of a cast shadow is assessed at each rotation of the component, until the shadow is minimized (at a cusp), thereby establishing the x or y relative position of the component. As with the method described in Skunes, the present invention is not limited to any specific sort of light source. In particular, the wavelength of the light, nor its coherence, nor its phase are critical in the present invention. The main criteria for the source is that it provides light of sufficient intensity, so that after passing through the cavity area which accepts the components and whatever filters which may be present, the light received at the detector has enough intensity to provide a robust signal for the electronics. The present invention can be practiced with multiple light sources, even where the sources are off-axis with respect to the optical axis of the optics in the optical path of the component shadows.

The embodiments of the present method and apparatus shown in this application are shown with a point light source, although workers skilled in the art will recognize that the present invention applies equally well to other types of light sources, like a light source effectively at infinity which produces parallel rays of light in the vicinity of the components.

FIG. 4 shows an embodiment of the present invention in a sensor 200 which blocks wide-angle glints 210 with a combination of an aperture at an image of the source and positive optics 104. Components of sensor 200 which are numbered the same as in previously described Figures have the same functions. The sensor 200 of the present invention is secured onto a pick and place machine of the any appropriate type, one type shown in FIG. 3. This embodiment of the present invention includes an aperture 202 situated in the plane of a focal point of images of the shadows 206,208 cast by components 1 and 2. An undesirable large-angle glint 210 is specularly reflected off component 2, is passed through optics 104 and is now blocked by aperture 202. Aperture 202 is preferably made of a material which substantially maintains its dimensions over an appropriate operating range and has an opening in it which is designed to allow for manufacturing tolerances of the optics, electronics components and the sensor housing. Aperture 202 blocks wide-angle glints such as glint 210, but passes a small-angle glint as shown with glint 212. The embodiment of PIG. 4 effectively moves the detector plane behind the image of the component plane, as with the previously described embodiment, but also adds the aperture 202 to block wide-angle glints. As discussed above, any glint passing through aperture 202 will be imaged at the edge of the shadow, as seen at the image of the component plane, but will fall onto the detector 204 between the shadows of the two components so that edge detection electronics 220 may selectively capture the appropriate images. FIG. 4 also illustrates various functions of a pick and place machine including position and orientation circuitry 222 which controls motor drive circuitry 224. Elements 220, 222 and 224 can be implemented separately or as a single circuit and can be implemented using analog to digital components or their combination.

In FIG. 5, source 100 emits light which shines on components 1 and 2. Components 1 and 2 block the light to form shadow images 302,304 which are passed through lens 300. Lens 300 is a positive power lens appropriately positioned so that it will form a real image of the source, but form only a virtual image of the component plane. As before, the shadows pass through an aperture 202. In addition, the shadows pass through a positive power lens 306 which substantially collimates the light rays forming the shadow images of the components 1 and 2 and produces a real image of the component plane. Preferably, lens 306 only collimates in the XY plane and does not affect focusing in the Z direction. The collimated images are then detected at detector 308, which is positioned in back of the image of the component plane. The placement of the detector is significant in this embodiment of the present invention, in that if it is placed too far behind the image of the component plane, the glint 210 will fall within the shadow for component 1. Although the light forming the shadow images is collimated, the glint 210 is not collimated, which causes glint 210 to reach detector 308 at a position between the images of the two shadows. Electronics 222 can easily recognize the spurious signal due to glint 210 which can be ignored in subsequent computations.

Figure 6:
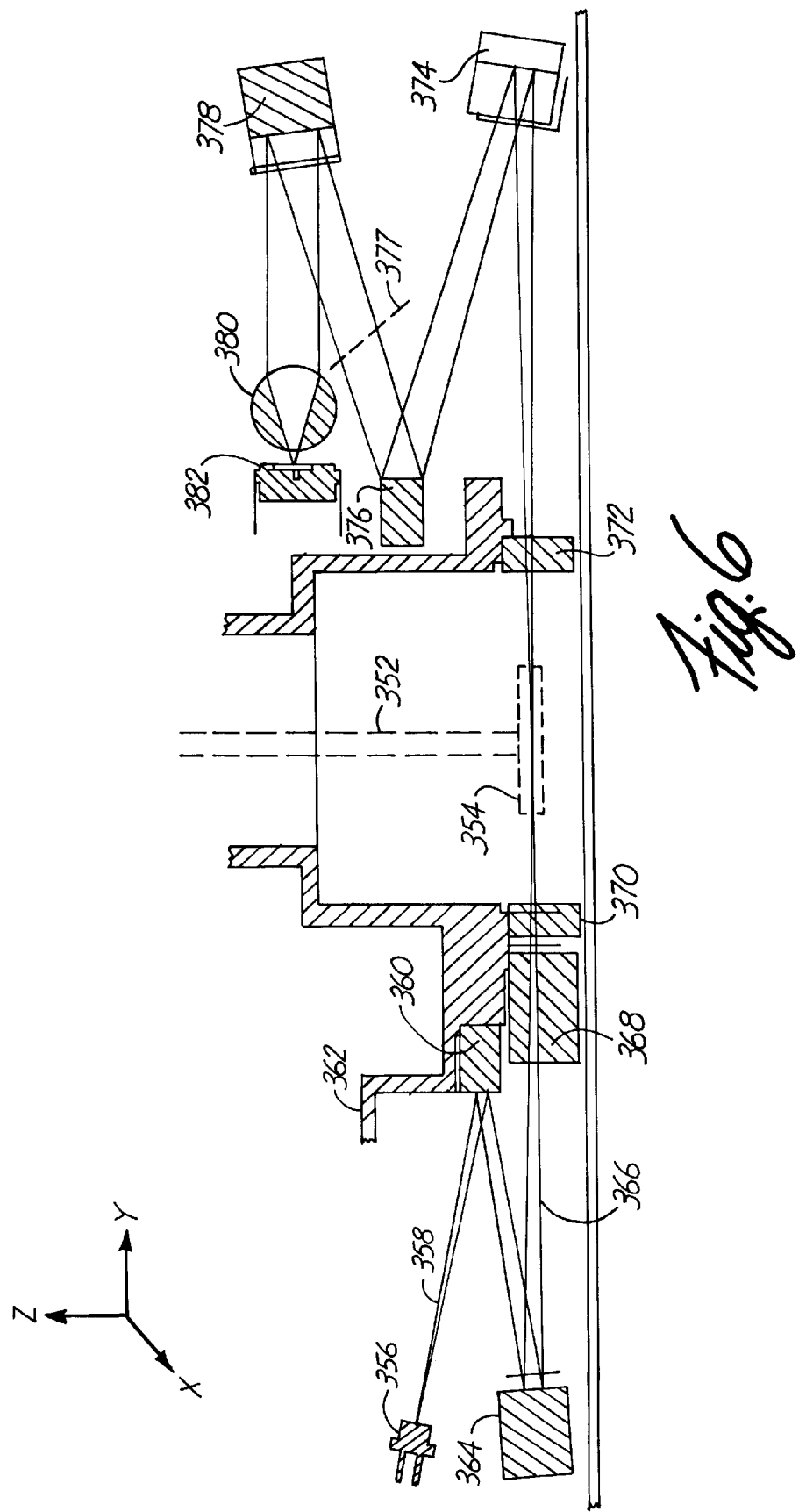
FIG. 6 shows a further embodiment of the present invention in a sensor housing suitable for mounting in a pick and place machine.

FIG. 6 is a side cross-sectional view and FIG. 7 is a perspective view of a sensor 350 in accordance with one embodiment which implements both aspects of the invention.

In FIG. 6, a sensor 350 is adapted to receive multiple nozzles 352 with components 354 on their respective ends. A laser diode 356 source emits light 358, which is reflected off of a flat mirror 360 located inside the housing 362 of the sensor 350. The mirror 360 directs the light to a second mirror 364, which re-directs the light as shown and also narrows the light in the z dimension to make a ribbon (stripe) of light 366. The stripe 366 is then passed through a cylindrical collimating lens 368 so that all the rays of light are substantially parallel in the x-y plane. The ribbon of light 366 passes through a window 370 and enters the cavity, impinging on the edge of the components 354. The light which is not blocked by the components 354 now passes through another window 372 in the housing 362, and is reflected off of a third mirror 374 with positive power which re-directs the light. Mirror 374 corresponds to lens 300 in FIG. 5, for example. The light next reflects off of a fourth mirror 376, which reflects the light through aperture 377 and onto a fifth mirror 376 with positive power. Aperture 377 corresponds to aperture 202 and mirror 378 corresponds to lens 306 in FIG. 5, for example. Finally, the light passes through a rod lens 380 before falling on a linear detector 382. Although the present invention is implemented with a linear detector 382 for economic reasons, the present invention may also be practiced with an area array as appropriate.

The present invention is also shown herein within one housing. In practice, it may be advantageous to have two or more housings for practicing the method of the present invention, such as a separate housing for is the collimated or point light source.

All the presently described sensors for aligning multiple components are shown with a single source. However, the method and apparatus of the present invention is not limited to single source embodiments of multi-nozzle position alignment sensors, but is understood to cover ones with multiple effective light sources. Furthermore, the present invention may be practiced regardless of the relative motion of the components or their placement within the sensor cavity. In other words, one may practice the present invention and rotate as many nozzles as desired with any relative placement of the nozzles. Furthermore, the present invention is disclosed with lenses, but may be implemented with equivalent optical components, such as curved mirrors or the like. Although the present invention has been described in terms of determining the width of a shadow, the invention can be used with any application which determines shadow edge position of at least two components and is affected by glint. Furthermore, the term "light" as used herein includes non-visible radiation. Although the present invention has been described with reference to preferred embodiments, workers skilled in the art will recognize that changes can be made in form and detail without departing from the spirit and scope of the invention.

What is claimed is:

1. A method of controlling glint in a position alignment sensor which aligns at least two components, the method comprising:

shining light onto the components, each of the components blocking the light to cast a shadow of the outline of the components, some of the light specularly reflected from one of the components to provide a large-angle glint;

passing the light through an optic with positive power to thereby focus the two shadows at a focal point, the optic focusing an image of the shadows at a first plane located behind the focal point;

positioning an aperture substantially at the focal point, the aperture having an opening positioned to allow the rays of light to pass therethrough and to block the large-angle glint; and positioning a detector beyond the focal point to detect the shadows.

2. The method of claim 1 wherein positioning the detector includes positioning the detector substantially parallel to the first plane and there-behind, so that an unfocused image of the shadows fall on the detector to thereby identify a small angle glint.

3. The method of claim 1 including rotating the components around their central axes until a cusp representative of the shadow outline is located.

4. The method of claim 1 including aligning an additional component illuminated by the light.

5. The method of claim 1 wherein shining light comprises shining a point light source within the housing.

6. The method of claim 1 wherein shining light comprises providing substantially parallel rays of light in a vicinity of the components.

7. A method of reducing glint in a position alignment sensor which aligns at least two components, the method comprising:

shining light onto the at least two components from a source, the source located in a source plane and the components located in a component plane, at least some of light specularly reflected off one of the components to provide a large-angle glint, the components blocking some of the light to form a shadow image of each of the at least two components;

passing the shadow images through an optic with positive power to provide focused shadow images of each component focused at a common focal point, the optic additionally passing the large-angle glint; and passing the rays through an opening in ar aperture, the aperture positioned at the focal point, the opening in the aperture having a size to block the large-angle glint.

8. The method of claim 7 including positioning a detector to detect the shadows.

9. The method of claim 8 wherein positioning the detector includes positioning the detector at a first plane located behind the focal point.

10. The method of claim 9 wherein positioning the detector includes positioning the detector substantially parallel to the first plane and there-behind, so that an unfocused image of the shadows fall on the detector to thereby identify a small angle glint.

11. The method of claim 7 including rotating the components around their central axes until a cusp representative of the shadow outline is located.

12. A position alignment sensor adapted to align at least two components, the apparatus comprising:

a housing adapted to accept at least two components;

a light source located in a source plane for shining light on the at least two components, the light oriented substantially perpendicular to a central axis of each of the components so that the components block the light to form respective shadow images, a glint specularly reflected off one of the components;

optics with positive power adapted to receive the shadow image and provide focused shadow images, the focused shadow images focused at a focal point and imaged at a first plane behind the focal point;

an aperture with an opening therethrough blocking the glint and passing the focused shadow images; and a detector positioned behind the aperture.

13. The apparatus of claim 12 wherein the detector is located substantially at the first plane.

14. The apparatus of claim 12 wherein the optics comprise a first and a second optic, and the detector is positioned behind the second optic.

15. The apparatus of claim 12 where the detector is located behind the first plane of the components so that the glint is incident on the detector between the focused shadow images of each of the components.

16. The apparatus of claim 12 wherein the light source comprises a point light source.

17. The apparatus of claim 12 wherein the light source provides substantially parallel rays of light in a vicinity of the components.

* * * * *

UNITED STATES PATENT AND TRADEMARK OFFICE
CERTIFICATE OF CORRECTION

PATENT NO.   : 6,291,830 B1                                        Page 1 of 1
DATED        : September 18, 2001
INVENTOR(S)  : David W. Duquette It is certified that error appears in the above-identified patent and that said Letters Patent is hereby corrected as shown below:

<u>Title page, Item [54] and Column 1, line 2,</u>
Insert -- IMPROVED -- and after "IN A" insert -- MULTI-NOZZLE --
Item [73], Assignee, change "Coporation" to -- Corporation --

Signed and Sealed this

Tenth Day of September, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,291,830 B1
DATED : September 18, 2001
INVENTOR(S) : David W. Duquette It is certified that error appears in the above-identified patent and that said Letters Patent is hereby corrected as shown below:

<u>Title page, Item [54] and Column 1, line 2,</u>
Title, insert -- IMPROVED -- and after "IN A" insert -- MULTI-NOZZLE --
Item [73], Assignee, change "Coporation" to -- Corporation --

Signed and Sealed this

Fifteenth Day of October, 2002

*Attest:*

*Attesting Officer*

JAMES E. ROGAN
*Director of the United States Patent and Trademark Office*